United States Patent
Li et al.

(10) Patent No.: US 10,608,655 B1
(45) Date of Patent: Mar. 31, 2020

(54) INTER-STAGE GAIN CALIBRATION IN DOUBLE CONVERSION ANALOG-TO-DIGITAL CONVERTER

(71) Applicant: Analog Devices, Inc., Norwood, MA (US)

(72) Inventors: Hongxing Li, Andover, MA (US); Jesper Steensgaard-Madsen, Sequim, WA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/212,378

(22) Filed: Dec. 6, 2018

(51) Int. Cl.
| | |
|---|---|
| *H03M 1/38* | (2006.01) |
| *H03M 1/10* | (2006.01) |
| *H03M 1/06* | (2006.01) |
| *H03M 1/14* | (2006.01) |

(52) U.S. Cl.
CPC ....... *H03M 1/1057* (2013.01); *H03M 1/1009* (2013.01); *H03M 1/069* (2013.01); *H03M 1/145* (2013.01)

(58) Field of Classification Search
CPC .......... H03M 1/164; H03M 1/46; H03M 1/44; H03M 1/468; H03M 1/1009; H03M 1/1245; H03M 1/466; H03M 1/124; H03M 1/12; H03M 1/145; H03M 1/38; H03M 1/1215; H03M 1/462; H03M 1/002; H03M 1/0863
USPC .......... 341/155, 156, 161–163, 172
See application file for complete search history.

(56) References Cited

U.S. PATENT DOCUMENTS

| | | |
|---|---|---|
| 4,641,129 A | 2/1987 | Doluca et al. |
| 5,006,854 A | 4/1991 | White et al. |
| 5,635,937 A | 6/1997 | Lim et al. |
| 5,977,894 A | 11/1999 | McCarroll et al. |
| 6,184,809 B1 | 2/2001 | Yu |
| 6,384,757 B1 | 5/2002 | Paavo |
| 6,606,042 B2 | 8/2003 | Sonkusale et al. |
| 6,778,123 B1 | 8/2004 | Bock et al. |
| 6,784,824 B1 | 8/2004 | Quinn |
| 6,839,009 B1 | 1/2005 | Ali |
| 6,894,627 B2 | 5/2005 | Janakiraman et al. |

(Continued)

FOREIGN PATENT DOCUMENTS

| | | |
|---|---|---|
| CN | 104363020 A | 2/2015 |
| CN | 104410417 | 7/2017 |
| KR | 101660416 | 9/2016 |

OTHER PUBLICATIONS

"U.S. Appl. No. 15/019,381, Non Final Office Action dated May 27, 2016", 9 pgs.

(Continued)

*Primary Examiner* — Linh V Nguyen
(74) *Attorney, Agent, or Firm* — Schwegman Lundberg & Woessner, P.A.

(57) ABSTRACT

Various background calibration techniques to calibrate inter-stage gain, e.g., in pipelined ADCs, are described to allow open loop amplifier circuits to be used as residue amplifiers for better power efficiency. Using various techniques, a well-controlled perturbation can be injected between two conversions and the actual perturbation after a residue amplifier can be measured. By comparing the actual measurement against an expected value, the gain information of the residue amplifier can be estimated and then calibration can be applied.

26 Claims, 6 Drawing Sheets

(56) References Cited

U.S. PATENT DOCUMENTS

| | | | |
|---|---|---|---|
| 7,006,028 B2* | 2/2006 | Galton | H03M 1/0673 |
| | | | 341/144 |
| 7,142,138 B2 | 11/2006 | Chen et al. | |
| 7,187,310 B2 | 3/2007 | El-Sankary et al. | |
| 7,312,734 B2 | 12/2007 | McNeill et al. | |
| 7,609,184 B2* | 10/2009 | Kuramochi | H03M 1/1047 |
| | | | 341/118 |
| 7,786,910 B2 | 8/2010 | Ali | |
| 8,031,092 B1 | 10/2011 | Sun | |
| 8,362,939 B2 | 1/2013 | Buter et al. | |
| 8,487,792 B2 | 7/2013 | Erdmann | |
| 8,531,328 B2* | 9/2013 | Jeon | H03M 1/164 |
| | | | 341/156 |
| 8,587,466 B2 | 11/2013 | Debnath et al. | |
| 8,653,998 B2 | 2/2014 | Haneda et al. | |
| 8,659,461 B1* | 2/2014 | Zhu | H03M 1/1019 |
| | | | 341/155 |
| 8,754,794 B1 | 6/2014 | Li et al. | |
| 8,754,799 B2 | 6/2014 | Coln et al. | |
| 8,766,839 B2 | 7/2014 | Janakiraman et al. | |
| 8,884,801 B1* | 11/2014 | Ranjbar | H03M 1/145 |
| | | | 341/156 |
| 8,907,826 B2 | 12/2014 | Hong et al. | |
| 8,981,972 B2 | 3/2015 | Shen et al. | |
| 9,054,727 B2 | 6/2015 | Steensgaard-Madsen | |
| 9,362,937 B1 | 6/2016 | Burgio et al. | |
| 9,362,938 B2 | 6/2016 | Zare-Hoseini et al. | |
| 9,608,655 B1* | 3/2017 | Li | H03M 1/069 |
| 9,641,189 B2 | 5/2017 | Maddox et al. | |
| 9,735,794 B1 | 8/2017 | Sabu et al. | |
| 9,882,575 B1* | 1/2018 | Li | H03M 1/468 |
| 9,912,343 B1 | 3/2018 | Li et al. | |
| 10,348,319 B1* | 7/2019 | Monangi | H03M 1/46 |
| 2010/0079317 A1 | 4/2010 | Feddeler et al. | |
| 2010/0079325 A1 | 4/2010 | Berens et al. | |
| 2010/0090873 A1 | 4/2010 | Yang | |
| 2010/0225513 A1 | 9/2010 | Lin | |
| 2011/0043395 A1 | 2/2011 | Sun et al. | |
| 2012/0075128 A1 | 3/2012 | Aruga et al. | |
| 2012/0256774 A1 | 10/2012 | Dey et al. | |
| 2012/0306671 A1 | 12/2012 | Kapusta et al. | |
| 2013/0044015 A1 | 2/2013 | Reinhold et al. | |
| 2013/0088375 A1 | 4/2013 | Wu et al. | |
| 2013/0187802 A1 | 7/2013 | de Figueiredo | |
| 2014/0184434 A1* | 7/2014 | Chen | H03M 1/145 |
| | | | 341/155 |
| 2016/0182075 A1 | 6/2016 | Devarajan et al. | |
| 2016/0352349 A1* | 12/2016 | Yoshioka | H03M 1/124 |

OTHER PUBLICATIONS

"U.S. Appl. No. 15/170,051, Notice of Allowance dated Nov. 16, 2016", 9 pgs.

"U.S. Appl. No. 15/371,864 Preliminary Amendment dated May 31, 2017", 11 pgs.

"U.S. Appl. No. 15/371,864, Notice of Allowability dated Jan. 25, 2018", 7 pgs.

"U.S. Appl. No. 15/371,864, Notice of Allowance dated Apr. 19, 2017", 11 pgs.

"U.S. Appl. No. 15/371,864, Notice of Allowance dated Sep. 5, 2017", 10 pgs.

"U.S. Appl. No. 15/371,864, Notice of Allowance dated Dec. 6, 2017", 9 pgs.

Ahmed, Imran, et al., "An 11-Bit 45 MS/s Pipelined ADC With Rapid Calibration of DAC Errors in a Multibit Pipeline Stage", IEEE Jornal of Solid-State Circuits, 43:7, (Jul. 2008), 1626-1637.

Ahmed, Imran, et al., "DAC nonlinearity and residue gain error correction in a pipelined ADC using a split-ADC architecture", IEEE Ph.D, Research in Microelectronics and Electronics, Otranto, Italy, (Sep. 2006), 5 pgs.

Chaojie, Fan, et al., "Nonlinear Inter-Stage Gain Calibration for Pipelined ADCs Employing Dual Dithering Modes", IEICE Electronics Express, 11:23, (Nov. 2014), 9 pgs.

Chiu, Yun, et al., "Digital Calibration of SAR ADC", Proceedings of the 10th International Conference on Sampling Theory and Applications (SampTA), URL: http://www.eurasip.org/Proceedings/Ext/SampTA2013/papers/p544-chiu.pdf (Jul. 2013), 544-547.

Chiu, Yun, "Nonlinear inter-stage gain calibration for pipelined ADCs employing double dithering modes", University of Texas at Dallas, utdallas.edu, (Mar. 12, 2014), 62 pgs.

Ding, Ming, et al., "A 5.5fJ/conv-step 6.4MS/s 13b SAR ADC Utilizing a Redundancy-Facilitated Background Error-Detection-and-Correction Scheme", IEEE International Solid-State Circuits Conference, (2015), 460-461.

Hong, Hyeok-Ki, et al., "A 2.6b/cycle-Architecture-Based 10b 1.7GS/s 15.4mW 4x-Time-Interleaved SAR ADC with a Multistep Hardware-Retirement Technique", ISSCC Session 26, (2015), 3 pgs.

Hurrell, Christopher P., et al., "An 18b 12.5MHz ADC with 93dB SNR", IEEE International Solid-State Circuits Conference, (2010), 378-379.

Jamal, Shafiq M., et al., "Calibration of Sample-Time Error in a Two-Channel Time-Interleaved Analog-to-Digital Converter", IEEE Transactions on Circuits and Systems—Regular Papers, 51:1, (Jan. 2004), 130-139.

Kapusta, Ron, et al., "A 14b 80 MS/s SAR ADC With 73.6 dB SNDR in 65 nm CMOS", IEEE Journal of Solid-State Circuits, vol. 48, No. 12, (Dec. 2013), 8 pgs.

Keane, John P., et al., "Background Interstage Gain Calibration Technique for Pipelined ADCs", IEEE Transactions on Circuits and Systems—Regular Papers, 52:1, (Jan. 2005), 32-43.

Li, Jipeng, "Accuracy Enhancement Techniques in Low-Voltage High-Speed Pipelined ADC Design", Ph.D Dissertation, Oregon State University, (Oct. 2003), 135 pgs.

Li, Shaolan, et al., "A 13-ENOB 2nd-Order Noise-Shaping SAR ADC Realizing Optimized NTF Zeros Using an Error-Feedback Structure", ISSCC Session 14 / High-Resolution ADCs / 14.3, (Feb. 13, 2018), 3 pages.

Liu, Chun-Cheng, et al., "A 10b 100MS/s 1.13mW SAR ADC with Binary-Scaled Error Compensation", ISSCC 2010 / Session 21, (2010), 3 pgs.

Liu, Wenbo, et al., "A 12-bit, 45-MS/s, 3-mW Redundant Successive-Approximation-Register Analog-to-Digital Converter With Digital Calibration", IEEE Journal of Solid State Circuits, vol. 46, No. 11, (Nov. 2011), 2661-2672.

McLachlan, Roddy C., et al., "A 20b Clockless DAC With Sub-ppm INL, 7.5 nV/vHz Noise and 0.05 ppm/°C. Stability", IEEE Journal of Solid-State Circuits, vol. 48, No. 12, (Dec. 12, 2013), 3028-3037.

McNeill, John A., et al., "All-Digital Background Calibration of a Successive Approximation ADC Using the "Split ADC" Architecture", IEEE Transactions on Circuits and Systems—Regular Papers, vol. 58, No. 10, (Oct. 2011), 2355-2365.

Raaja, M. Ganesh, et al., "Calibrating Amplifiers and ADCs in SoCs", Cypress Semiconductor Corp., www.cypress.com, (2012), 9 pgs.

Sun, Nan, et al., "A 2.9-mW 11-b 20-MS/s Pipelined ADC with Dual-Mode-Based Digital Background Calibration", IEEE Proceedings of the ESSCIRC, (Sep. 2012), 4 pgs.

Wang, et al., "IRD Digital Background Calibration of SAR ADC With Coarse Reference ADC Acceleration", IEEE Transactions on Circuits and Systems II: Express Briefs, vol. 61, No. 1, (Jan. 2014).

Xu, Hongda, et al., "A 78.5dB-SNDR Radiation- and Metastability-Tolerant Two-Step Split SAR ADC Operating up to 75MS/s with 24.9mW Power Consumption in 65nm CMOS", IEEE International Solid-State Circuits Conference, (2017), 475-477.

"Chinese Application Serial No. 201911237796.1, Notification to Make Rectification dated Jan. 3, 2020", 1 pg.

* cited by examiner

INTER-STAGE GAIN CALIBRATION IN DOUBLE CONVERSION ANALOG-TO-DIGITAL CONVERTER

FIELD OF THE DISCLOSURE

This document pertains generally, but not by way of limitation, to integrated circuits, and more particularly, to analog-to-digital converter circuits and systems.

BACKGROUND

Electronic systems can include analog-to-digital (A/D) converters (ADCs). Converting analog signals to digital quantities allows processors in electronic systems to perform signal processing functions for the systems. Performance of ADC circuits can depend on environmental conditions such as temperature and on variations that can occur during manufacturing. A higher accuracy ADC circuit, e.g., in which the number of bits of the ADC circuit is twelve or greater, may need calibration multiple times during its working life to avoid errors.

SUMMARY OF THE DISCLOSURE

This disclosure describes various background calibration techniques to calibrate inter-stage gain, e.g., in pipelined ADCs, to allow open loop amplifier circuits to be used as residue amplifiers for better power efficiency. Using various techniques, this disclosure describes injecting a well-controlled perturbation between two conversions and measuring the actual perturbation after a residue amplifier. By comparing the actual measurement against an expected value, the gain information of the residue amplifier can be estimated and then calibration can be applied.

In some aspects, this disclosure is directed to a method of estimating a residue gain in an analog-to-digital converter (ADC) circuit having a residue gain amplifier coupled to a digital-to-analog converter (DAC) circuit. The method comprises generating a first residue voltage of a sample of an analog input signal with respect to a first code applied to the DAC, amplifying the first residue voltage using the residue gain amplifier to provide a first amplified residue voltage, generating a second residue voltage of the sample of the analog input signal with respect to a second code applied to the DAC, amplifying the second residue voltage using the residue gain amplifier to provide a second amplified residue voltage, and comparing the first and second amplified residue voltages to a difference between the first and second codes applied to the DAC to determine information about the residue gain of the residue gain amplifier.

In some aspects, this disclosure is directed to an analog-to-digital converter (ADC) circuit for estimating a residue gain of a residue gain amplifier coupled to an output of a digital-to-analog converter (DAC) circuit. The ADC circuit comprises at least one reference capacitor coupled to the input of the residue gain amplifier, a control circuit configured to control application of first and second codes to the at least one reference capacitor to generate corresponding first and second residue voltages of a sample of an analog input signal, the first and second residue voltages amplified by the residue gain amplifier to generate first and second amplified residue voltages, and a back-end circuit coupled to an output of the residue gain amplifier, the back-end circuit configured to compare the first and second amplified residue voltages to a difference between the first and second codes applied to the at least one reference capacitor to determine information about the residue gain of the residue gain amplifier.

In some aspects, this disclosure is directed to an analog-to-digital converter (ADC) circuit for estimating a residue gain of a residue gain amplifier coupled to an output of a digital-to-analog converter (DAC) circuit. The ADC circuit comprises means for generating a first residue voltage of a sample of an analog input signal with respect to a first code applied to the DAC, means for amplifying the first residue voltage using the residue gain amplifier to provide a first amplified residue voltage, means for generating a second residue voltage of the sample of the analog input signal with respect to a second code applied to the DAC, means for amplifying the second residue voltage using the residue gain amplifier to provide a second amplified residue voltage, and means for comparing the first and second amplified residue voltages to a difference between the first and second codes applied to the DAC to determine information about the residue gain of the residue gain amplifier.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Higher accuracy ADCs may need repeated calibration. In general, there are two types of ADC calibration: foreground calibration and background calibration. Foreground calibrations are usually done at factory test or at chip power up, or at any other chosen time slots dedicated for the ADC calibration. The downside of foreground calibration is that it may not track chip supply and temperature changes when performed only at the factory. Also, it can involve extra manufacturing test cost and it may be necessary to interrupt the operation of the ADC to perform calibration during use in the field.

In comparison, background calibration works in the background and can be transparent to the normal ADC operation during which analog-to-digital signal conversions are ongoing. Also, because background calibration works in the background of normal operation, it may track the effects of supply and temperature on the ADC components.

The present inventors have recognized that a need exists to calibrate the large Process (P), Voltage (V), and Temperature (T) (or "PVT") variation of inter-stage gain of analog-to-digital converter (ADC) architectures that include a residue amplifier to amplify a residue by a gain, such as in pipelined ADC architectures. To help improve inter-stage gain accuracy, closed-loop gain stages that are designed to settle fully can be used as residue amplifiers. However, such closed-loop gain stages can consume significant amounts of power. Open-loop amplifiers and closed-loop amplifiers that are designed for incomplete settling can also be used as residue amplifiers, and such amplifiers may consume relatively less power. In some implementations, open-loop residue amplifiers are sometimes called "dynamic amplifiers" (e.g. integrators) to capture the property that they do not settle to a substantially stable output value, as many closed-loop residue amplifiers are designed to do. For open-loop amplifiers (including dynamic amplifiers) and closed-loop amplifiers that are designed for incomplete settling, it may be challenging to maintain an effective gain that is stable with respect to variations in temperature and other environmental parameters.

This disclosure describes various background calibration techniques to calibrate inter-stage gain, e.g., in pipelined ADCs, to allow open loop amplifier circuits to be used as residue amplifiers for better power efficiency. Using various techniques, this disclosure describes injecting a well-controlled perturbation between two operations within a conversion cycle and measuring the actual perturbation after a residue amplifier. By comparing the actual measurement against an expected value, the gain information of the residue amplifier can be estimated and then calibration can be applied.

Another calibration approach can inject a reference signal and statistically extract the error at the output of the ADC. However, because the error is mixed with the injected signal, the calibration speed can be slow. Using the techniques of this disclosure, the error calibration can potentially be completed much faster—within several samples, for example.

Although described with respect to pipelined ADCs, the techniques of this disclosure are not limited to pipelined ADCs. Rather, the techniques are applicable to any ADC architecture that has a residue to be amplified by an amplifier circuit by a known gain.

Figure 1:
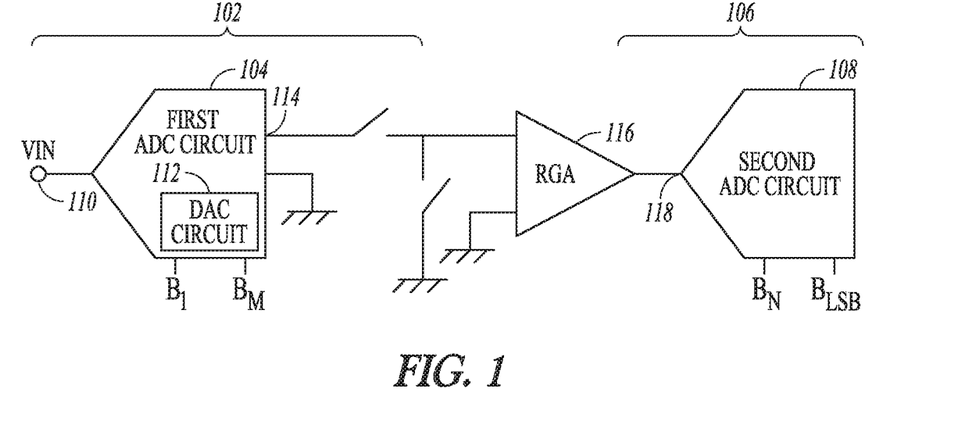
FIG. 1 is a block diagram of an example of a pipelined ADC circuit that can be used to implement various techniques of this disclosure.

In a pipelined ADC, the analog-to-digital converter can be divided into several stages, each stage including an analog-to-digital converter, and each stage being responsible for processing an individual part of the result. An example of a pipelined ADC circuit is shown in FIG. 1. In some example configurations, the pipelined ADC circuit of FIG. 1 can be a pipelined successive approximation register (SAR) ADC circuit.

FIG. 1 is a block diagram of an example of a pipelined ADC circuit that can be used to implement various techniques of this disclosure. A pipelined ADC circuit 100 can include a first stage 102 that has a first ADC circuit 104 and a second stage 106 that has a second ADC circuit 108. The first ADC circuit 104 can receive an input signal $V_{in}$ at an input node 110 and can generate a digital approximation of the input signal of which it derives the first M bits $B_1$ to $B_M$ of a conversion result. There can be an difference between the actual input value $V_{in}$ and the corresponding digitized value $B_1$ to $B_M$ as derived by a digital to analog converter (DAC) circuit 112 provided within the analog to digital converter 104. The difference between the analog input signal $V_{in}$ and the corresponding analog representation of the digital result is output as a residue voltage at a residue output 114 of the first ADC circuit 104.

In order to facilitate the operation of the second ADC circuit 108 that converts the lower order bits $B_N$ to $B_{LSB}$ where LSB represents the least significant bit, the residue can be applied to a residue gain amplifier (RGA) 116 interposed between the residue output 114 of the first ADC circuit 104 and a signal input 118 of the second ADC circuit 108.

The provision of the residue gain amplifier 116 means that the magnitude of the input signal $V_{in}$ to the second analog to digital converter 108 is significantly increased by the gain of the residue amplifier 116, thereby simplifying the design of the second ADC circuit 108 and improving its performance in terms of signal to noise ratio.

The pipelined converter topology can also allow an increase in digital throughput. Thus, for example, while the second ADC circuit 108 is converting the least significant bits $B_N$ to $B_{LSB}$ of a Dth word, the first ADC circuit 104 can be converting the most significant bits $B_1$ to $B_M$ of a D+1th conversion.

The residue amplifier 116 of FIG. 1 can see a large PVT variation of inter-stage gain. As mentioned above, this disclosure describes various background calibration techniques to calibrate the inter-stage gain, e.g., in the pipelined ADC 100 of FIG. 1, to allow an open loop architecture to be used for residue amplifier 116 for better power efficiency.

Figure 2:
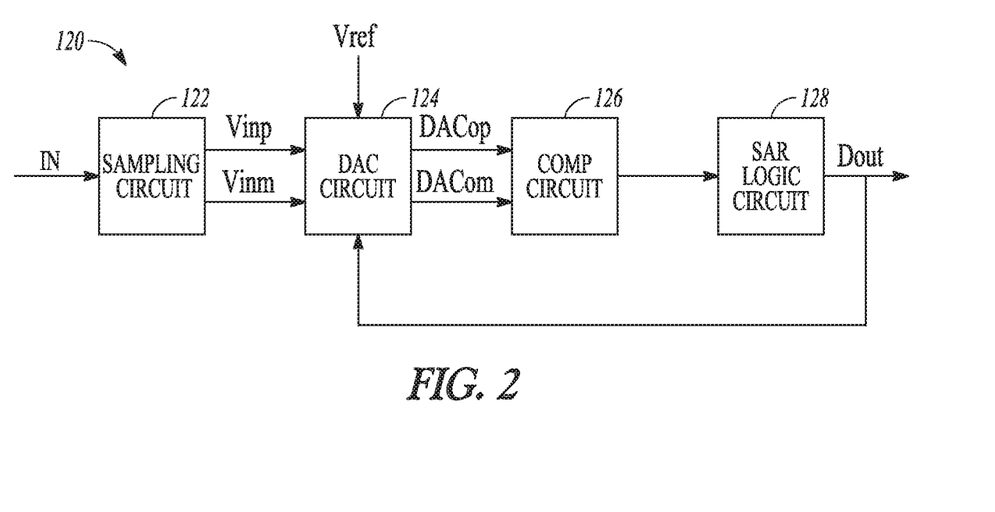
FIG. 2 is a functional block diagram of an example of a successive approximation register (SAR) ADC.

As mentioned above, in some example configurations, a pipelined SAR ADC circuit can be used. An example of a SAR ADC circuit is shown in FIG. 2. In the pipelined ADC circuit 100 of FIG. 1, each stage of the circuit can include a SAR ADC, such as SAR ADC 120 in FIG. 2.

FIG. 2 is a functional block diagram of an example of a SAR ADC 120. In the example, a differential analog input voltage is sampled and held using sampling circuit 122, and a differential output voltage of a DAC circuit 124 is compared to the sampled and held voltage using comparator circuit 126. The bit values of the DAC circuit 124 are adjusted based on the output of the comparator circuit. The conversion can start with the DAC set to midscale. The comparator 126 determines whether the DAC output is greater or less than the sampled input voltage and the result is stored as a one or zero for that bit of the DAC. Conversion then proceeds to the next bit value until all bits of the digital value are determined. One iteration of changing the DAC output and comparing the voltage to the sampled input can be referred to as a bit trial. SAR logic and control circuitry 128 controls the ADC operation during the bit trials. When the bit trials are complete, the digital value Dout of the sampled and held voltage is output.

In some example implementations, the DAC circuit 124 can include two switched capacitor DAC (CDAC) arrays, a first CDAC referred to as "P-DAC" and connected to a non-inverting input of the comparator 126, and a second CDAC referred to as "N-DAC" and connected to an inverting input of the comparator 126. Each CDAC includes a plurality of capacitors, each capacitor having first and second plates.

Each of the capacitors of the CDAC array has an associated switch that is operable to selectively connect a first plate, e.g., the lowermost or "bottom" plate, to either the first reference voltage Vrefp or to the second reference voltage "Vrefn" depending on the bit trial result. Generally, Vrefn corresponds to ground and Vrefp is positive relative to Vrefn. In some implementations, the basic SAR algorithm can involve a "Guess→Decide→Set" manner in switching bit trial capacitors. Each bit can be "set", e.g., connected to Vrefp, at the start of that particular bit trial, and based on the bit trial output, that bit setting can be kept or "reset", e.g., connected to Vrefn.

As mentioned above, in some example configurations, a pipelined SAR ADC circuit can be used. In the pipelined ADC circuit 100 of FIG. 1, each stage of the circuit can include a SAR ADC, such as the SAR ADC 120 in FIG. 2. Although described with respect to pipelined ADCs, the techniques of this disclosure are not limited to pipelined ADCs. Rather, the techniques are applicable to any ADC architecture that has a residue to be amplified by an amplifier circuit by a known gain.

As mentioned above, this disclosure describes injecting a well-controlled perturbation between two operations within a conversion cycle and measuring the actual perturbation after a residue amplifier. By comparing the actual measurement against an expected value, the gain information of the residue amplifier can be derived and then calibration can be applied. In an example implementation described below, a reference capacitor can be included in the ADC to which the perturbation, e.g., a signal or "code", can be applied, e.g., randomly applied. The reference capacitor can be a capacitor that is not used during conversion operations and can be dedicated for inter-stage gain calibration operations. A known shift of a residue voltage can be induced by way of the reference capacitor to characterize the residue amplifier.

Figure 3:
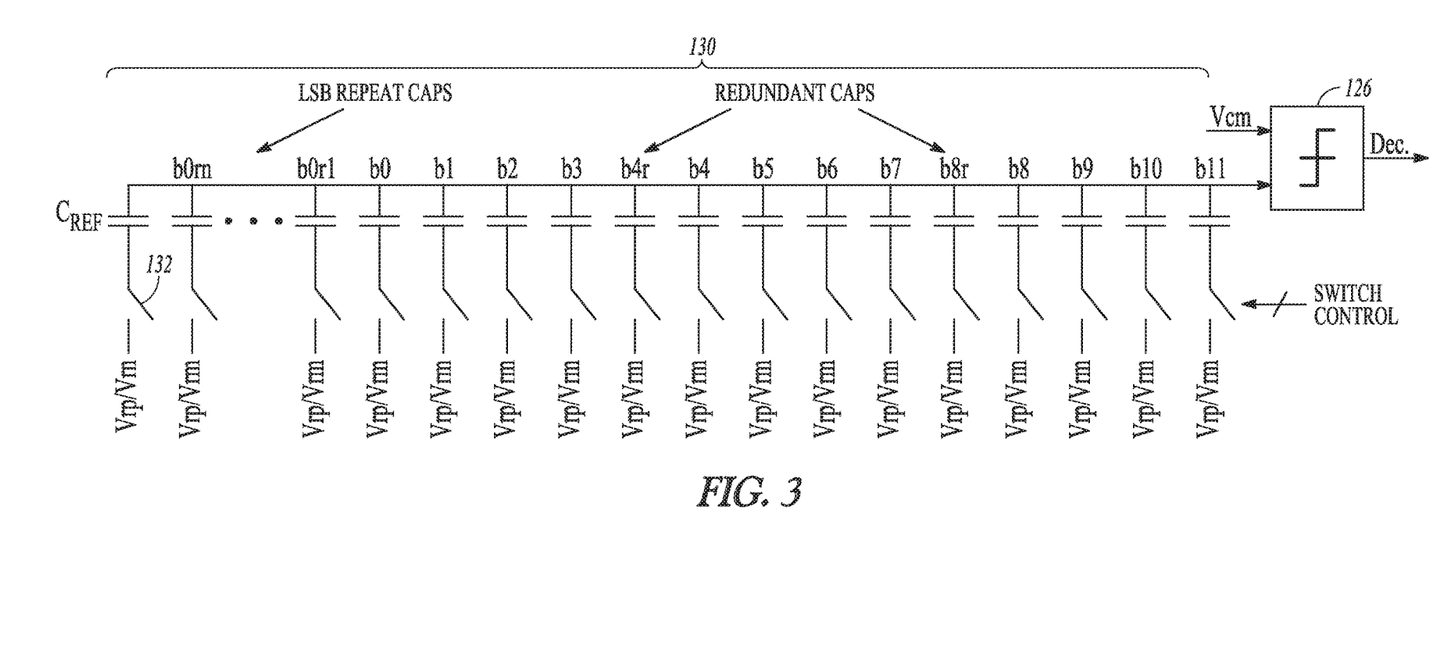
FIG. 3 is a circuit diagram of portions of an example of the ADC circuit of FIG. 2 that can be used to implement various techniques of this disclosure.

FIG. 3 is a circuit diagram of portions of an example of the ADC circuit of FIG. 2 that can be used to implement various techniques of this disclosure. The ADC circuit can include a DAC circuit 130, e.g., a capacitive DAC or resistive DAC, that can be an example of the DAC circuit 124 of FIG. 2. In the non-limiting configuration shown in FIG. 3, the DAC circuit 130 is depicted as a 12-bit capacitive DAC, but the number of bits N may vary (e.g., 16-bits) in different implementations. A single-ended DAC is shown in FIG. 3 for simplicity, but the actual implementation of the ADC can include a fully differential DAC circuit.

The bit positions of the DAC circuit are represented by weighted circuit components. In the example shown, the weighted circuit components are capacitors, and the value of the capacitance of the capacitors provides the weight of the component. In some examples, the circuit components are weighted according to a radix-2 numbering system. In some examples, the circuit components are weighted according to a non-radix-2 numbering system (e.g., radix-1.9 or radix-1.7).

The DAC circuit 130 can include a number n repeat bits of LSB bit b0, or n LSB repeats, labeled b0r1 to b0rn, and the number n of repeat bits may vary in different implementations. The number of LSB repeats may vary and they may follow other bits as well. In some examples, the DAC circuit 130 can include bit repeats of bits lower than the LSB of the DAC circuit. For instance, the repeat bits could be weighted half of the weight of the LSB (e.g., sub-LSBs bs11 . . . bs1n), a quarter of the weight of the LSB (sub-LSBs bs1, bs21 . . . bs2n), or one-eighth of the weight of the LSB (sub-LSBs bs1, bs2, bs31 . . . bs3n).

In some examples, the DAC circuit includes r weighted circuit components, wherein r is a number of redundant bits for bits that higher order than the LSB. In the example of FIG. 3, the DAC circuit 130 can include redundant bits for bit eight and bit four, labeled b8r and b4r respectively, to signify that the redundant bits are weighted the same as bits b8 and b4. The number of redundant bits and the positions of them are not necessarily restricted to the example shown in FIG. 3.

A sampling circuit, e.g., the sampling circuit 122 of FIG. 2, can sample the input voltage at the input to the ADC circuit and apply the sampled input voltage to the weighted circuit components. The comparator circuit 126 can compare an output voltage of the DAC circuit 130 to a specified threshold voltage during a bit trial. If the DAC circuit is a differential DAC circuit, the sampling circuit can sample a differential input voltage, and the comparator circuit can compare a differential output voltage of the DAC circuit to the specified threshold voltage.

The SAR logic and control circuitry 128 of FIG. 2 can control operation for the bit trials. The logic circuitry 128 may include a state machine to progress the ADC circuit through the bit trials or can include a processor performing instructions to progress the ADC through the bit trials. The bit trials are performed for the N bits of the DAC circuit, and may include bit trials for one or both of the LSB repeats and the r redundant bits.

In accordance with this disclosure and as mentioned above, a reference capacitor can be included in the DAC circuit 130 to which the perturbation, e.g., a voltage signal or "code", can be applied in a controlled manner, e.g., randomly. The reference capacitor can be a capacitor that is not used during conversion operations and can be dedicated for inter-stage gain calibration operations. The reference capacitor can be fundamentally independent of the analog input because it is not used for approximating the input but used to provide a known perturbation of the two codes so that a gain of the residue amplifier can be estimated. In FIG. 3 on the left-hand side, a reference capacitor $C_{REF}$ is shown.

In some example implementations, the control circuit, e.g., SAR logic and control circuit 128 of FIG. 2, can control a switch 132 to close and apply a first code to the reference capacitor $C_{REF}$ during sampling, transfer a first residue voltage of stage 1 to a back-end circuit, e.g., a residue amplifier and one or more ADCs. Then, the control circuit can apply a second code having a polarity opposite the first code to the reference capacitor $C_{REF}$ and transfer a second amplified residue voltage of stage 1 to the back-end circuit. Then, the two amplified residue voltages can be compared to a difference between the first and second codes applied to the capacitive DAC to derive at least some information about the gain of the residue amplifier (also referred to as a residue gain amplifier), which can be used for calibration.

It should be noted that a reference capacitor is just one way of introducing a perturbation into the circuit for gain calibration. In other implementations, the DAC circuit could be implemented as partly capacitive and partly resistive. For example, the code or reference signal could be applied to a resistor ladder that is later coupled to a capacitor DAC circuit. As such, the techniques of this disclosure are not limited to reference capacitors or capacitor DAC circuits.

It should also be noted that the reference capacitor $C_{REF}$ need not be physically part of the DAC circuit. Rather, it can be a capacitor that is separate from the DAC circuit. The techniques of this disclosure are applicable whether or not the reference capacitor $C_{REF}$ is part of the same physical structure of the DAC circuit. In several of the following figures, the reference capacitor $C_{REF}$ is depicted apart from the DAC circuit, for purposes of illustration and explanation.

Figure 4:
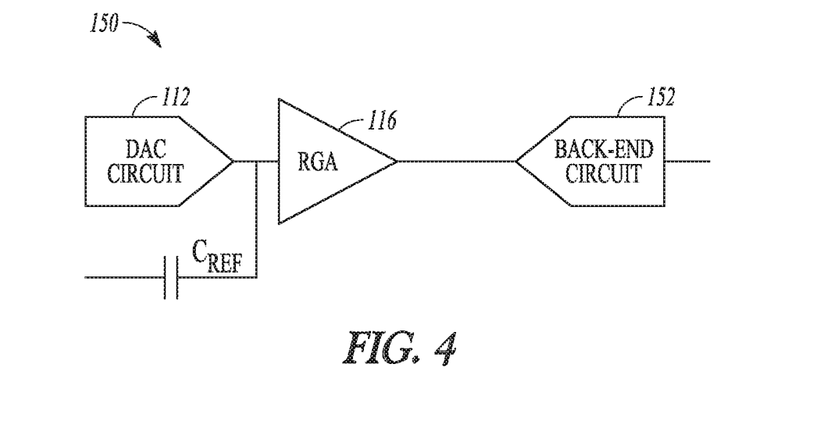
FIG. 4 is a portion of a block diagram of an example of a pipelined ADC circuit that can implement various techniques of this disclosure.

FIG. 4 is a portion of a block diagram of an example of a pipelined ADC circuit that can implement various techniques of this disclosure. The portion of the ADC circuit 150 depicted can include a DAC circuit 112, which can be part of a first ADC of a first stage, e.g., part of the first ADC circuit 102 of FIG. 1, a residue gain amplifier (RGA) 116 to amplify the residue from the first stage of the ADC, and a back-end circuit 152, such as a comparator or a second ADC, e.g., second ADC circuit 108 of FIG. 1. It should be noted that a comparator can be considered a 1-bit ADC circuit.

The portion of the ADC circuit 150 depicted can further include a reference capacitor $C_{REF}$ to which a voltage signal or "code", can be applied, e.g., randomly applied. The reference capacitor can be a capacitor that is not used during conversion operations and can be dedicated for inter-stage gain calibration operations. In some implementations, the reference capacitor may be part of the DAC circuit 112, and it may be used as part of an ADC conversion operation, e.g., a SAR ADC operation.

For purposes of explanation only, assume the left-hand terminal of the reference capacitor $C_{REF}$ is adjusted by 1 volt (V). The right-hand terminal of the reference capacitor $C_{REF}$ can move by less than 1V. This attenuation can depend on the ratio of the reference capacitor $C_{REF}$ to the capacitance of the DAC circuit (whether or not reference capacitor $C_{REF}$ is physically part of the structure of the DAC circuit 112). The techniques described in this disclosure can measure the product of the attenuation factor and the gain of the RGA 116. Any uncertainty of the measurement can depend on the ratio of the capacitors. These techniques can be of particular interest for designs in which the gain of the RGA 116 is not set by a capacitor ratio.

In some example implementations, a control circuit, e.g., SAR logic and control circuit 128 of FIG. 2, can control a switch (not depicted) to close and randomly apply a first signal to the reference capacitor $C_{REF}$ during sampling, where the random signal applies a positive reference voltage or a negative reference voltage (or ground), transfer a first amplified residue voltage of stage 1 to a back-end circuit, e.g., a comparator or one or more ADCs. Then, the control circuit can randomly apply a second signal to the reference capacitor $C_{REF}$ and transfer a second amplified residue voltage of stage 1 to the back-end circuit. Then, the two amplified residue voltages can be compared to a difference between the first and second codes applied to the capacitive DAC representing the analog input signal to determine information about the gain of the residue amplifier (also referred to as a residue gain amplifier), which can be used for calibration.

For example, on a first sample of the analog input signal, the control circuit can perform several bit trials to derive a first code representing the analog input signal (or the first code can be derived using a separate circuit) and apply the first code to the DAC. The control circuit can randomly apply a first signal to the left side of the reference capacitor $C_{REF}$, where the random signal is a positive reference voltage or a negative reference voltage (or ground). Then, the RGA 116 can generate and transfer a first amplified residue voltage (or simply "residue") to the second stage. The residue voltage of a sample of an analog signal is the difference between the voltage that was sampled with respect to the first code, e.g., the effective voltage, that was applied to the DAC. The back-end circuit 152 can determine a code of the first residue, where the code of the first residue represents the amplified residue.

Next, using the first sample, the control circuit can apply a second code representing the analog input signal to the DAC. In configurations in which the reference capacitor $C_{REF}$ is not part of the DAC circuit 112, the second code can be the same as the first code. The control circuit can randomly apply a second signal to the reference capacitor $C_{REF}$.

In configurations in which the reference capacitor $C_{REF}$ is part of the DAC circuit 112, the second code can be different from the first code in order to provide the random signal to the reference capacitor $C_{REF}$. That is, in some examples in which the reference capacitor $C_{REF}$ is part of the DAC circuit 112, the difference between the first code applied and the second code applied can be the toggling of a single capacitor, e.g., the reference capacitor $C_{REF}$, between a first state, e.g., positive reference voltage, and a second state, e.g., negative reference voltage. In some such implementations, an absolute value of the difference between the first and second codes applied to the DAC can be a predetermined value. For example, the single capacitor, e.g., the reference capacitor $C_{REF}$, goes from high to low (now a negative value) or from low to high (now the same absolute positive value).

Because its sampled, the voltage on a terminal on the reference capacitor $C_{REF}$ can be adjusted to cause a known shift in the residue voltage. For purposes of explanation only, assume there is a 1 millivolt (mV) shift. Then, the control circuit can perform several bit trials using the first stage of the ADC circuit and can generate and transfer a second amplified residue voltage to the second stage using the RGA 116. The second residue voltage is the difference between the voltage that was sampled with respect to the second code, e.g., the effective voltage, that was applied to the DAC.

The back-end circuit 152 can determine a code of the second residue, where the code of the second residue represents the amplified residue plus the known shift, e.g., 1 mV. The back-end circuit 152 can then compare the first and second amplified residue voltages to a difference between the first and second codes applied to the DAC to determine information about a gain of the residue gain amplifier 116. The difference between the two codes of the residues can represent the numerical change that happens at the output of the ADC circuit when a known shift is applied at the input of the RGA 116. The back-end ADC circuit can use the numerical change to estimate the gain of the entire signal chain, including both the gain stage and the back-end circuit. As such, the back-end ADC circuit 152 can estimate the gain of the RGA 116 by measuring the difference between the two residues.

As indicated above, the back-end circuit 152 can determine information about a gain of the RGA 116. In an example implementation, the back-end circuit 152 can be a comparator circuit that generally evaluates the amplified residue voltages to determine which one of the first and second amplified residue voltages is greater than the other. Two codes were applied to the DAC circuit and for a given gain the amplified residue voltages should be separated by an anticipated value "X", e.g., 1 mV. The comparator circuit can determine whether the change in amplified residue voltages is greater than the anticipated value "X", e.g., 1 mV. In this manner, the comparator circuit can determine whether the anticipated value was too small, for example. Using these techniques, this information can allow the ADC to adaptively estimate a gain of the residue gain amplifier, using several steps to estimate the gain by either increasing or decreasing an estimated value based on the determined information. In some implementations, it can be desirable to estimate a gain using an average of several conversion cycles to minimize or filter out noise.

In some implementations, the ADC circuit 150 can determine an output code representing the sample of the analog input signal, e.g., Dout in FIG. 2, where the output code is based on the first and second codes as well as the first and second amplified residue voltages. That is, now that the ADC circuit 150 has determined the two residues from the first and second codes applied to the DAC and amplified both, the back-end circuit 152 can use the amplified residues to determine the output code of the ADC for that particular sample of the analog input signal. Each of the amplified residues can consume power to generate. Generally speaking, improving suppression of noise may require increasing power consumption. Using both amplified residues can provide an acceptable tradeoff between the power consumed and the noise suppressed.

Figure 5:
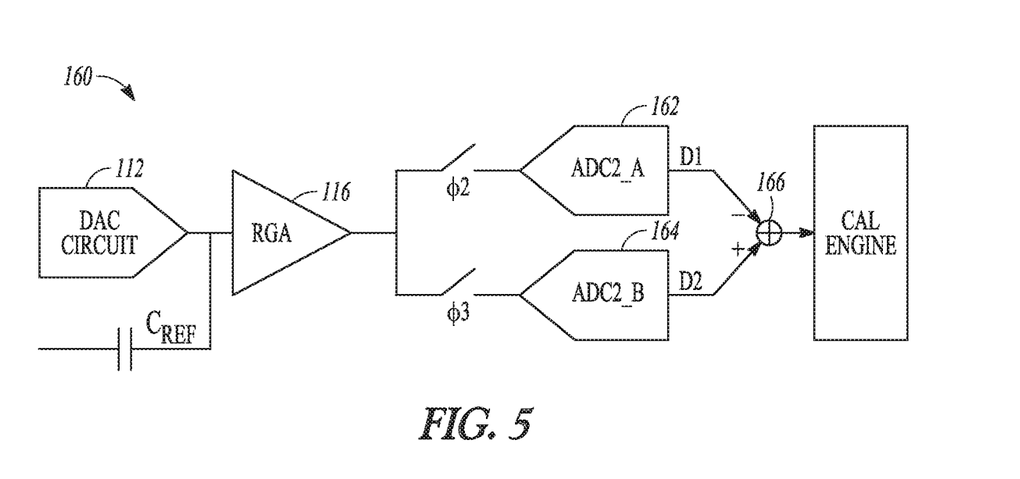
FIG. 5 is a portion of a block diagram of another example of a pipelined ADC circuit that can implement various techniques of this disclosure.

In some example implementations, such as shown in FIG. 5, two back-end ADC circuits can be used to convert the amplified residue voltages from the previous stage of the pipelined ADC circuit.

FIG. 5 is a portion of a block diagram of another example of a pipelined ADC circuit that can implement various techniques of this disclosure. The portion of the ADC circuit 160 depicted can include a DAC circuit 112, which can be part of a first ADC of a first stage, e.g., part of the first ADC circuit 102 of FIG. 1, a residue gain amplifier (RGA) 116 to amplify the residue from the first stage of the ADC, and two back-end ADCs circuits, namely ADC2_A 162 and ADC2_B 164. The back-end ADC circuit ADC2_A 162 can output a first digital code D1 and the back-end ADC circuit ADC2_B 164 can output a second digital code D2, which can be compared by a subtraction circuit 166 and applied to a calibration engine 168, which can be part of the SAR logic circuit 128 of FIG. 2.

The portion of the ADC circuit 160 depicted can further include a reference capacitor $C_{REF}$ to which a voltage signal can be applied, e.g., randomly applied. The reference capacitor can be a capacitor that is not used during conversion operations and can be dedicated for inter-stage gain calibration operations.

The two back-end ADCs circuits, namely ADC2_A 162 and ADC2_B 164, can operate concurrently, which can improve the conversion speed of the two residues. A first residue amplified by RGA 116 can be sampled by ADC2_A during a phase φ2. Then, the reference capacitor $C_{REF}$ can be toggled and a second residue can be generated, as described above. The second residue can be amplified by RGA 116 and sampled by ADC2_B during a phase φ3.

In some example implementations, the control circuit, e.g., SAR logic and control circuit 128 of FIG. 2, can control a switch to close and apply a first random signal to the reference capacitor $C_{REF}$ during sampling, transfer a first amplified residue voltage of stage 1 to the back-end ADC circuit ADC2_A 162. The back-end ADC circuit ADC2_A 162 can determine a first code representing the first amplified residue voltage.

Then, the control circuit can apply a signal having a polarity opposite the first random signal to the reference capacitor $C_{REF}$ and transfer a second amplified residue voltage of stage 1 to the back-end ADC circuits. The back-end ADC circuit ADC2_B 164 can determine a second code representing the second amplified residue voltage. Then, the control circuit can compare the two codes representing the amplified residue voltages (the first and second codes) to a difference between the codes applied to the DAC that represent the analog input signal to determine at least some information about the gain of the residue amplifier, which can be used for calibration. It should be noted that in some example configurations, rather than use two separate back-end ADC circuits as in FIG. 5, one back-end ADC circuit can be used twice to generate the first and second codes from the first amplified residue voltage and the second amplified residue voltage.

In addition to being used for calibration purposes, the four codes (the two codes representing the two amplified residue voltages and the two codes that were applied to the DAC circuit) can be used to determine an output code for the ADC circuit representing the sample of the analog input signal. That is, the output code of the ADC circuit 160 can be based on the two codes applied to the DAC circuit (including reference capacitor CAF) and the two codes determined from the first and second amplified residues.

Figure 6:
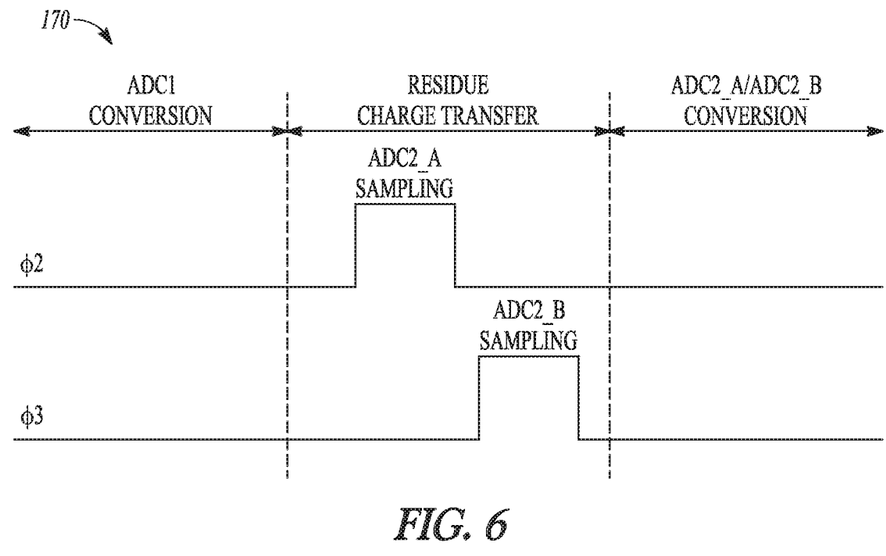
FIG. 6 is a portion of an example of a timing diagram for the pipelined ADC circuit of FIG. 5.

FIG. 6 is a portion of an example of a timing diagram 170 for the pipelined ADC circuit of FIG. 5. After the conversion of the first stage of the pipelined ADC ("ADC1 conversion"), the residue charge transfer phase can begin. During the residue charge transfer phase, the first residue amplified by RGA 116 can be sampled by ADC2_A 162 during a phase φ2. Then, the reference capacitor $C_{REF}$ can be toggled and a second residue can be generated, as described above. The second residue can be amplified by RGA 116 and sampled by ADC2_B 164 during a phase φ3.

During a conversion phase, each of the two back-end ADCs circuits ADC2_A 162 and ADC2_B 164 can convert the samples and generate digital output codes, which can be compared by summation, subtraction, or another numerical operation.

As mentioned above, the use of the parallel back-end ADC circuits can improve the overall speed of the ADC circuit. However, there can be gain mismatches between the ADCs circuits ADC2_A 162 and ADC2_B 164. As such, the accuracy of the measurement can be limited. Therefore, to overcome the gain mismatches and improve the accuracy of the measurement, it can be desirable in some example configurations for the control circuit to randomly select which back-end ADC circuit ADC2_A 162 and ADC2_B 164 to select first.

Figure 7:
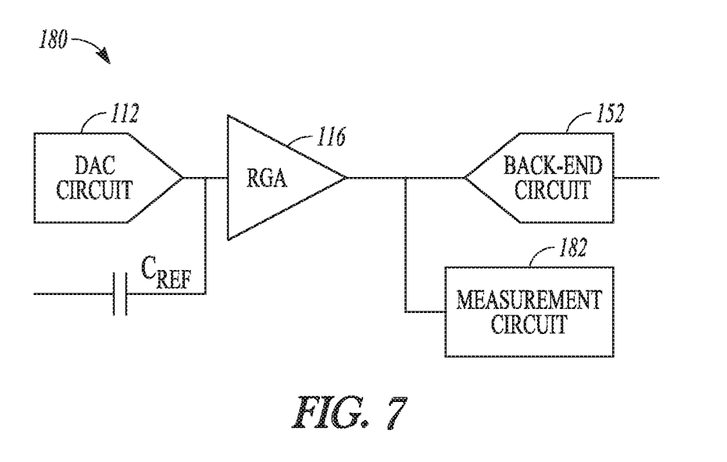
FIG. 7 is a portion of a block diagram of another example of a pipelined ADC circuit that can implement various techniques of this disclosure.

FIG. 7 is a portion of a block diagram of another example of a pipelined ADC circuit that can implement various techniques of this disclosure. The circuit 180 of FIG. 7 can be similar to the circuit of FIG. 4, with the addition of a measurement circuit 182. Rather than use two back-end ADC circuits, such as in FIG. 6, a measurement circuit 182 can be used to convert the difference in residues between the conversions. The measurement circuit 182 can measure a change in the output of the RGA 116.

In contrast to the example configuration shown in FIG. 6 that measures each of the two residues, the measurement circuit 182 of FIG. 7 can measure the difference between the two residues. In some example implementations, the measurement circuit 182 can include two sample capacitors. Each capacitor of the measurement circuit 182 can sample corresponding first and second residue voltages, combine them to generate a delta charge, and then convert the delta charge to a digital code or word using an ADC circuit.

In some example implementations, as described below with respect to FIGS. 8 and 9, it can be desirable to determine a polarity of the first residue voltage and then apply an opposite polarity to the reference capacitor $C_{REF}$ before the second residue voltage is generated, such as in a differential configuration.

Figure 8:
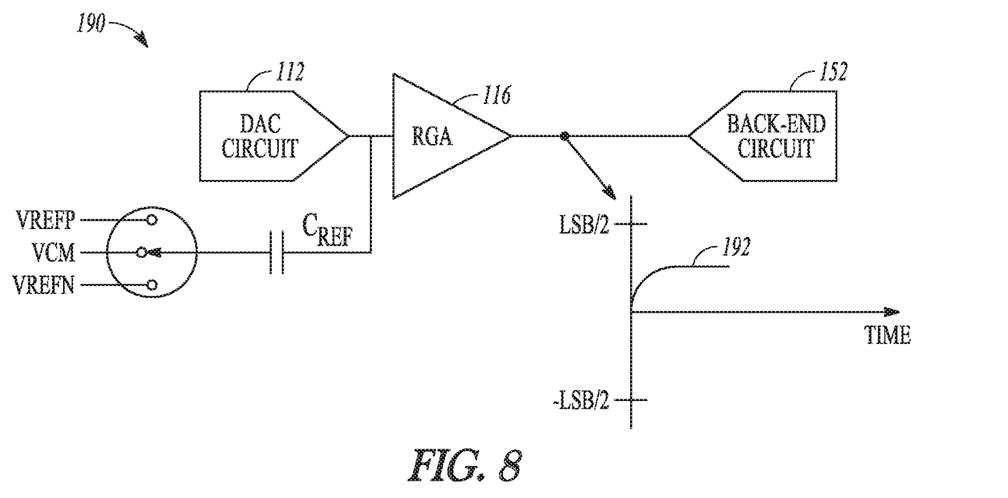
FIG. 8 is a portion of a block diagram of another example of a pipelined ADC circuit that can implement various techniques of this disclosure.

FIG. 8 is a portion of a block diagram of another example of a pipelined ADC circuit 190 that can implement various techniques of this disclosure. As seen in FIG. 8, the reference capacitor $C_{REF}$, can be coupled to one of a positive reference voltage $V_{REFP}$, a negative reference voltage $V_{REFN}$ (or ground), and a common-mode voltage $V_{CM}$. During the first residue generation, the reference capacitor $C_{REF}$ can be coupled to the common-mode voltage $V_{CM}$. In the example shown in FIG. 8, the output of the RGA 116 is positive and less than an LSB/2 of the DAC circuit 112, as seen at 192.

Figure 9:
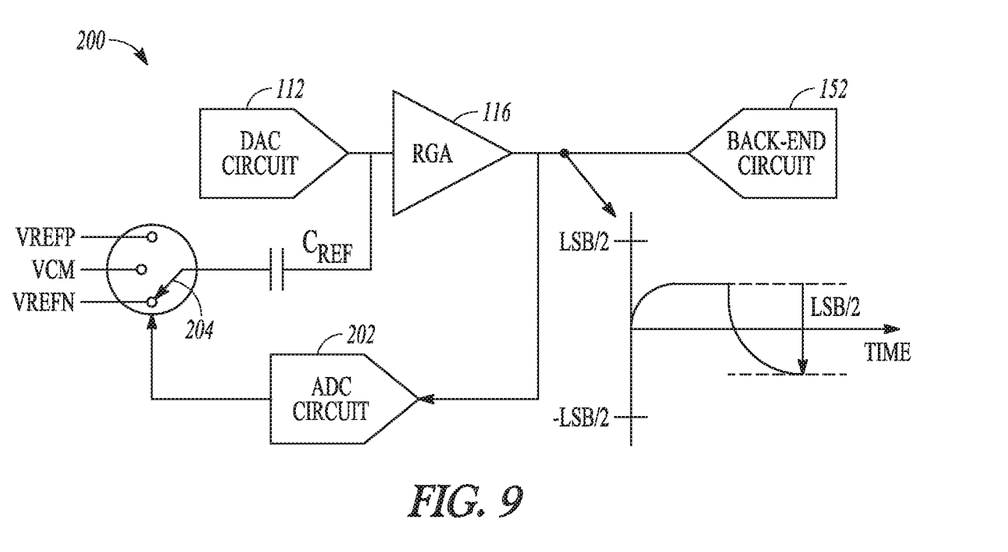
FIG. 9 is a portion of a block diagram of the example of a pipelined ADC circuit shown in FIG. 8 with an additional ADC circuit coupled to an output of the residue gain amplifier.

FIG. 9 is a portion of a block diagram of the example of a pipelined ADC circuit shown in FIG. 8 with an additional ADC circuit coupled to an output of the residue gain amplifier. In particular, the pipelined ADC circuit 200 of FIG. 9 can include an ADC circuit 202 coupled in a feedback configuration between the output of the RGA 116 and a switch 204 coupled to the reference capacitor $C_{REF}$.

During sampling, the reference capacitor $C_{REF}$ can be sampled against a common-mode voltage $V_{CM}$. After sampling the analog input voltage signal, the DAC 112 code can be determined as its best guess of the sampled input voltage, and this code can be applied to the DAC 112. The residue will most likely not be zero and will be either positive or negative. In a single-ended circuit configuration, a positive voltage means when the voltage is higher than a defined middle scale voltage, and the negative voltage means when the voltage is lower than the determined middle scale voltage. The middle scale voltage is usually the middle point between the minimal achievable voltage and the maximum achievable voltage at the residue amplifier output.

Then, the ADC circuit 202 can be used to determine the polarity of the first residue voltage and based on this information, the reference capacitor $C_{REF}$ left side can be switched from $V_{CM}$ to either the positive reference voltage $V_{REFP}$ or the negative reference voltage $V_{REFN}$ to move the residue voltage in the direction of opposite polarity by a delta that is determined by the size of the reference capacitor $C_{REF}$ and generate a second residue voltage. The second residue voltage can be bounded within the input range of the backend circuit 152. In this particular example, referring back to the input, the input range of the backend circuit 152 can be equivalent to +/−LSB/2 of the DAC circuit 112, and the reference capacitor $C_{REF}$ can be sized to produce a delta equal to half of the input range of the backend circuit 152. In another configuration, the reference capacitor $C_{REF}$ can be replaced by a multiple bit CDAC, and the ADC circuit 202 can be a multiple bit ADC to have a more precise control of the second residue voltage.

After the second residue voltage is generated, the backend circuit 152 can measure the difference between the first residue voltage and the second residue voltage and compare it with the expected value and derive the gain error information of the residue amplifier.

In some example implementations, the ADC circuit can determine a polarity of the first amplified residue voltage and select the second code based on the detected polarity. After the first residue generation, the ADC circuit 202, e.g., a 1-bit comparator, can sense the output of the RGA 116, and determine to which reference voltage the reference capacitor $C_{REF}$ is connected during the second conversion to push the residue voltage to the opposite sign by LSB/2. It should be noted that if the ADC circuit 202 has more resolution, the reference capacitor $C_{REF}$ can be replaced by a multi-bit DAC, for example.

Then, the ADC circuit 202 can control the switch 204 to couple the reference capacitor $C_{REF}$ to a reference voltage having a polarity opposite the determined polarity of the first residue voltage. In other words, how the reference capacitor $C_{REF}$ is toggled can be based on the polarity of the first residue voltage. In this manner, the ADC circuit 202 can help inject a maximum allowed amplitude to speed up the gain measurement.

For example, assume that the first residue is +5 mV and then a shift of +5 mV is added by the reference capacitor $C_{REF}$. It is possible that a +10 mV input voltage at the input of the residue gain amplifier 116 is too large, given that the range of input voltages for open loop or dynamic amplifiers can be small. As such, if there is a positive first residue, it may be desirable to add a shift having the opposite polarity to limit the peak value.

Determining how to toggle the reference capacitor $C_{REF}$ can be based on the polarity of the first residue voltage at the output of the RGA 116, as described above, is one approach. Another approach to toggling the reference capacitor $C_{REF}$ can be to randomly or pseudo-randomly control the switch 204 to couple the reference capacitor $C_{REF}$ to a reference voltage. In yet another approach to toggling the reference capacitor $C_{REF}$, zero shift can be applied in a first conversion and in a second conversion, a shift can be applied (or vice versa).

Figure 10:
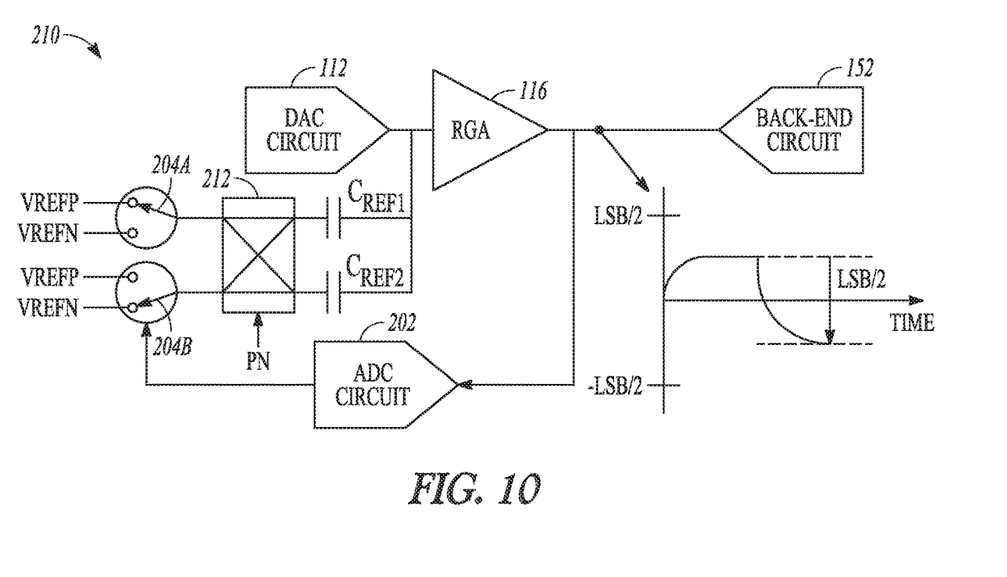
FIG. 10 is a portion of a block diagram of another example of a pipelined ADC circuit that can implement various techniques of this disclosure.

FIG. 10 is a portion of a block diagram of another example of a pipelined ADC circuit 210 that can implement various techniques of this disclosure. The ADC circuit shown in FIG. 10 can include features similar to the circuit shown in FIG. 9. In addition, the reference capacitor $C_{REF}$ and be split into two reference capacitors $C_{REF1}$ and $C_{REF2}$. Using two reference capacitors can help avoid the need to use a precision common-mode voltage.

Each of the two reference capacitors $C_{REF1}$ and $C_{REF2}$ can be coupled to one of a positive reference voltage $V_{REFP}$ and a negative reference voltage $V_{REFN}$ (or ground) via a chopper circuit 212. The chopper circuit 212 can be controlled by a random signal or pseudo-signal PN. The chopper circuit 212 can help correct for any mismatches between the two reference capacitors $C_{REF1}$ and $C_{REF2}$.

The chopper circuit 212 can be used to artificially create a common-mode voltage. By taking a single reference capacitor and splitting it into two halves with half connected to a positive reference voltage $V_{REFP}$ and the other half connected to a negative reference voltage $V_{REFN}$, the effective value is $V_{REF}/2$ or $V_{CM}$.

To generate the delta in the second residue, the two reference capacitors $C_{REF1}$ and $C_{REF2}$ can be the same size and can be initialize to 0 and 1. Then, one of the two reference capacitors $C_{REF1}$ and $C_{REF2}$ can be toggled during the second residue generation using switches 204A, 204B. A shuffler circuit, for example, can be used to average their usage.

As an example, during a first phase, the reference capacitor $C_{REF1}$ can be coupled to positive reference voltage $V_{REFP}$ and the reference capacitor $C_{REF2}$ can be coupled to negative reference voltage $V_{REFN}$. During a second phase and based on the decision made by the ADC circuit 202, either reference capacitor $C_{REF1}$ or $C_{REF2}$ can be toggled.

As mentioned above, for low noise applications, it can be desirable to use an open loop integrator or "dynamic amplifier" as the residue amplifier for inter-stage gain. However, the temperature variation of the gain can be high in such an implementation. The open loop integrator can generate current proportional to an input voltage and its output current can charge one or more capacitors in a back-end ADC circuit, for example.

The capacitors in the back-end ADC circuit can be charged for a fixed amount of time, e.g., the integration time. The voltage at a terminal of the capacitors can ramp up from 0 V to a value of the gain (A) multiplied by the residue voltage ($V_{RES}$). If either the transconductance $g_m$ of the open loop integrator increases or the capacitance of the capacitors decreases, the slope of the ramp can increase.

Using various techniques of this disclosure, two measurements can be performed and the difference between the two can be determined. For example, the capacitors in the back-end ADC circuit can be charged with a first current generated by the open loop integrator. Then, without resetting the capacitors in the back-end ADC circuit to preserve their charge from the previous conversion, the capacitors in the back-end ADC circuit can be charged with a second current generated by the open loop integrator from the second conversion and having opposite polarity. The effect is that the capacitors in the back-end ADC are storing the delta between the first and second residues.

Various techniques can be used to correct for the error between the two residues and thus calibrate the gain of the residue amplifier. To calibrate the gain of the residue amplifier, the control circuit can apply correction techniques in the digital domain, in the analog domain, or combination of the two domains.

For example, in the digital domain, the control circuit can scale a digital output code, e.g., from the back-end circuit 152, based on the estimated gain of the residue gain amplifier. By way of a non-limiting example, the first output code and the second output code can be added and then divided by the estimated gain of the residue gain amplifier.

In the analog domain, various parameters can be adjusted or trimmed to calibrate the gain of the residue amplifier. For example, an integration time of the capacitors in the back-end ADC circuit can be adjusted. In another example, the capacitance of the capacitors in the back-end ADC circuit can be adjusted. In another example, the transconductance $g_m$ of the residue gain amplifier can be adjusted.

Figure 11:
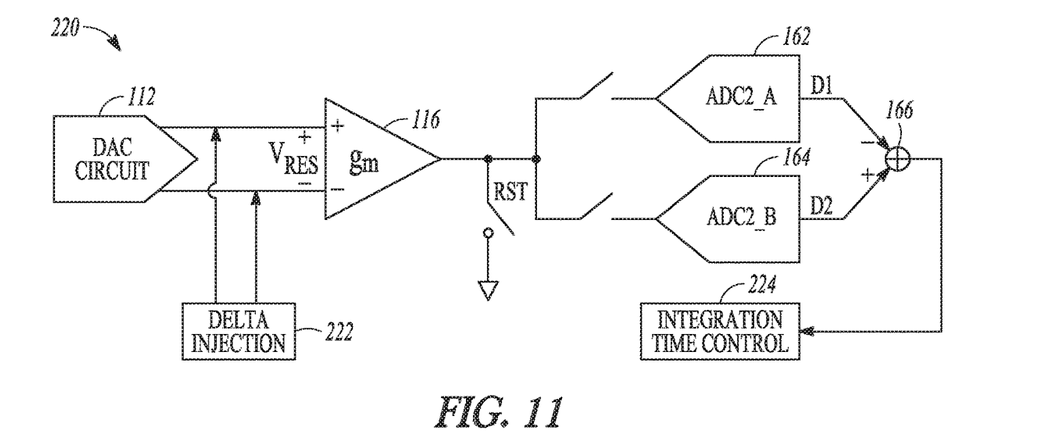
FIG. 11 is a portion of a block diagram of another example of a pipelined ADC circuit that can implement various techniques of this disclosure.

FIG. 11 is a portion of a block diagram of another example of a pipelined ADC circuit 220 that can implement various techniques of this disclosure. For purposes of illustration, the reference capacitor $C_{REF}$ and its toggling between states, as described above, has been replaced in FIGS. 11-12 with a "delta injection" block 222. As before, the reference capacitor $C_{REF}$, is toggled between the two residue generations, or "delta injection". The back-end ADC circuit ADC2_A 162 can output a first digital code D1 and the back-end ADC circuit ADC2_B 164 can output a second digital code D2. The difference D2−D1 can be used to measure the inter-stage gain of the residue gain amplifier 116, e.g., an open loop integrator. Then, as mentioned above, the difference D2−D1 can be applied to an integration time control circuit 224, e.g., including a filter, to adjust the integration time of the capacitors in the back-end ADC circuits.

Various Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of estimating a residue gain in an analog-to-digital converter (ADC) circuit having a residue gain amplifier coupled to a digital-to-analog converter (DAC) circuit, the method comprising:
generating a first residue voltage of a sample of an analog input signal with respect to a first code applied to at least one reference element coupled to the DAC;
amplifying the first residue voltage using the residue gain amplifier to provide a first amplified residue voltage;
generating a second residue voltage of the sample of the analog input signal with respect to a second code applied to the at least one reference element coupled to the DAC;
amplifying the second residue voltage using the residue gain amplifier to provide a second amplified residue voltage; and
comparing the first and second amplified residue voltages to a difference between the first and second codes applied to the at least one reference element coupled to the DAC to determine information about the residue gain of the residue gain amplifier.

2. The method of claim 1, further comprising:
determining an output code representing the sample of the analog input signal, wherein the output code is based on the first and second codes as well as the first and second amplified residue voltages.

3. The method of claim 1, wherein an absolute value of the difference between the first and second codes applied to the at least one reference element coupled to the DAC is a predetermined value.

4. The method of claim 1, further comprising:
determining a third code representing the first amplified residue voltage; and
determining a fourth code representing the second amplified residue voltage,
wherein comparing the first and second amplified residue voltages to a difference between the first and second codes applied to the at least one reference element coupled to the DAC includes combining the first, second, third, and fourth codes.

5. The method of claim 4, further comprising:
determining an output code for the ADC circuit representing the sample of the analog input signal, wherein the output code is based on each one of the first, second, third, and fourth codes.

6. The method of claim 1, wherein an expected polarity of the first residue voltage is opposite an expected polarity of the second residue voltage.

7. The method of claim 1, further comprising:
determining a polarity of first residue voltage; and
based on the determined polarity, adjusting the first residue voltage so as to move the first residue voltage in a direction of opposite polarity.

8. The method of claim 1, further comprising:
determining a polarity of the first amplified residue voltage and selecting the second code based on the determined polarity.

9. The method of claim 1, further comprising:
adaptively estimating the gain of the residue gain amplifier by either increasing or decreasing an estimated value of the gain based on the determined information.

10. The method of claim 1, further comprising:
trimming the residue gain amplifier using the determined information.

11. An analog-to-digital converter (ADC) circuit for estimating a residue gain of a residue gain amplifier coupled to an output of a digital-to-analog converter (DAC) circuit, the ADC circuit comprising:
at least one reference element coupled to the input of the residue gain amplifier;
a control circuit configured to control application of first and second codes to the at least one reference element to generate corresponding first and second residue voltages of a sample of an analog input signal, the first and second residue voltages amplified by the residue gain amplifier to generate first and second amplified residue voltages; and
a back-end circuit coupled to an output of the residue gain amplifier, the back-end circuit configured to compare the first and second amplified residue voltages to a difference between the first and second codes applied to the at least one reference element to determine information about the residue gain of the residue gain amplifier.

12. The ADC circuit of claim 11, wherein the back-end circuit includes first and second ADC circuits.

13. The ADC circuit of claim 12, wherein the control circuit randomly selects between the first and second ADC circuits.

14. The ADC circuit of claim 11, wherein the residue gain amplifier includes an open loop integrator circuit.

15. The ADC circuit of claim 11, further comprising:
a feedback ADC circuit coupled between an output of the residue gain amplifier and the at least one reference element, wherein the feedback ADC is configured to determine a polarity of the first amplified residue voltage and select the second code based on the determined polarity.

16. The ADC circuit of claim 15, wherein the at least one reference element, includes a first reference capacitor and a second reference capacitor, the ADC circuit further comprising:
a chopper circuit coupled to the first and second reference capacitors.

17. The ADC circuit of claim 11, wherein the at least one reference element forms part of the DAC circuit.

18. The ADC circuit of claim 11, wherein the control circuit includes a successive approximation register logic circuit.

19. An analog-to-digital converter (ADC) circuit for estimating a residue gain of a residue gain amplifier coupled to an output of a digital-to-analog converter (DAC) circuit, the ADC circuit comprising:
means for generating a first residue voltage of a sample of an analog input signal with respect to a first code applied to at least one reference element coupled to the DAC;

means for amplifying the first residue voltage using the residue gain amplifier to provide a first amplified residue voltage;

means for generating a second residue voltage of the sample of the analog input signal with respect to a second code applied to the at least one reference element coupled to the DAC;

means for amplifying the second residue voltage using the residue gain amplifier to provide a second amplified residue voltage; and means for comparing the first and second amplified residue voltages to a difference between the first and second codes applied to the at least one reference element coupled to the DAC to determine information about the residue gain of the residue gain amplifier.

20. The ADC circuit of claim 19, further comprising:

means for determining an output code representing the sample of the analog input signal, wherein the output code is based on the first and second codes as well as the first and second amplified residue voltages.

21. The method of claim 1, wherein the at least one reference element includes a capacitor.

22. The method of claim 1, wherein the at least one reference element includes a resistor.

23. The ADC circuit of claim 11, wherein the at least one reference element includes a capacitor.

24. The ADC circuit of claim 11, wherein the at least one reference element includes a resistor.

25. The ADC circuit of claim 19, wherein the at least one reference element includes a capacitor.

26. The ADC circuit of claim 19, wherein the at least one reference element includes a resistor.

* * * * *

UNITED STATES PATENT AND TRADEMARK OFFICE
CERTIFICATE OF CORRECTION

PATENT NO. : 10,608,655 B1
APPLICATION NO. : 16/212378
DATED : March 31, 2020
INVENTOR(S) : Li et al.

Page 1 of 1

It is certified that error appears in the above-identified patent and that said Letters Patent is hereby corrected as shown below:

In the Claims

In Column 16, Line 50, in Claim 16, delete "element," and insert --element-- therefor Signed and Sealed this
Twenty-first Day of July, 2020

Andrei Iancu
*Director of the United States Patent and Trademark Office*